(12) United States Patent
Koba

(10) Patent No.: US 6,887,626 B2
(45) Date of Patent: May 3, 2005

(54) ELECTRON BEAM PROJECTION MASK

(75) Inventor: Fumihiro Koba, Tokyo (JP)

(73) Assignee: NEC Electronics Corporation (JP)

( * ) Notice: Subject to any disclaimer, the term of this patent is extended or adjusted under 35 U.S.C. 154(b) by 98 days.

(21) Appl. No.: 10/055,689

(22) Filed: Jan. 23, 2002

(65) Prior Publication Data
US 2002/0098423 A1 Jul. 25, 2002

(30) Foreign Application Priority Data

Jan. 24, 2001 (JP) .......................... 2001-016085

(51) Int. Cl.$^7$ ................................................ G03F 9/00
(52) U.S. Cl. ........................... 430/5; 430/296; 430/942
(58) Field of Search ................................ 430/5, 296, 942

(56) References Cited

U.S. PATENT DOCUMENTS

| | | | | |
|---|---|---|---|---|
| 4,983,252 | A | * 1/1991 | Masui et al. ................ | 430/296 |
| 5,529,862 | A | 6/1996 | Randall ......................... | 430/5 |
| 5,973,333 | A | 10/1999 | Nakasuji et al. ............. | 250/492 |
| 6,277,542 | B1 | * 8/2001 | Okino et al. ................. | 430/296 |
| 6,447,960 | B2 | * 9/2002 | Yamashita et al. ............ | 430/5 |

FOREIGN PATENT DOCUMENTS

| | | |
|---|---|---|
| JP | 63-110634 | 5/1988 |
| JP | 5-062888 | 3/1993 |
| JP | 5-216216 | 8/1993 |
| JP | 7-66098 | 3/1995 |
| JP | 7-161605 | 6/1995 |
| JP | 09-320960 | 12/1997 |
| JP | 2000-058446 | 2/2000 |
| KR | 1998-079377 | 11/1998 |

* cited by examiner

*Primary Examiner*—Christopher G. Young
(74) *Attorney, Agent, or Firm*—Hayes Soloway P.C.

(57) ABSTRACT

The batch projection regions and of an electron beam projection mask are arranged so that pattern density may be equalized on the whole wafer surface.

9 Claims, 4 Drawing Sheets

ELECTRON BEAM PROJECTION MASK

BACKGROUND OF THE INVENTION

1. Field of the Invention

The Present invention relates to an electron beam projection mask, and particularly, to an electron beam projection mask (Electron-Beam exposure mask) for arranging a plurality of batch projection regions on a whole wafer surface.

2. Description of the Related Art

In recent years, in accordance with making high-density integrated circuits, an ultra-microfabrication technology is required for forming a semiconductor element and wiring which form an integrated circuit, and there is a demand for the development of a technique for realizing this circuit.

For example, in order to form a fine pattern having a line width of 0.1 $\mu$m or less, when a resist film is exposed, an electron beam is used to form the fine patterning.

Since the electron beam has a very short wavelength as a matter-wave when compared with a wavelength used in other exposure technologies and its diffraction aberration is so small that it can be disregarded, the electron beam exposure essentially has high resolution. However, in the electron beam exposure technique (EB direct drawing), since the pattern is drawn by a rectangular-shaped electron beam with a size of about several $\mu$m, the throughput is lowered. This method is called a variable-shaped electron beam exposure method.

In order to improve the throughput, a partial batch electron beam exposure (called a cell projection or block exposure) is used. This partial batch electron beam exposure technology is described, for example, in Publication of Japanese Laid-Open patent. No. 7-161605.

This partial batch electron beam exposure projects a pattern of several $\mu$m square area at once which appears repeatedly in a device pattern by using a stencil type electron beam mask (called Si stencil mask, an aperture, a partial batch mask, a cell projection mask, or a block mask) having at least one opening in Si film of about 20 $\mu$m of thickness. Accordingly, the number of shots of the electron beam is greatly reduced compared to the conventional EB direct drawing technology, and an improvement of throughput can be attained.

However, even if this partial batch electron beam exposure method is used, for a pattern without the repetition in patterns, the pattern must be directly drawn by the electron beam of the rectangle shape with a size of about several $\mu$m square (variable-shaped electron beam exposure method). For this reason, a further improvement in throughput is required for mass-production.

The electron beam exposure method which aims at a high throughput compared to a partial batch electron beam exposure method has been proposed in recent years. In this method, an electron beam reduction projection apparatus using a mask having a circuit pattern for a whole semiconductor chip, irradiates an electron beam at some region of the mask, thus the reduction pattern of the region passes a projection lens and forms an image of the pattern. Generally this technology is called an electron beam projection lithography (abbreviated as EPL). This EPL technology is described in Publication of Japanese Laid-Open patent No. 2000-58446, for example.

Conventionally, the region which can be projected at once by the variable-shaped electron beam exposure method or partial batch exposure method was as small as 5-$\mu$m square. However, with the above-mentioned EPL technology, the region which can be projected at once is quite large with 250-micrometer square, and, thereby, the throughput is improved greatly.

However, even if this partial batch electron beam exposure method is used, for a pattern without the repetition in patterns, the pattern must be directly drawn by the electron beam of the rectangle shape with a size of about several $\mu$m square (variable-shaped electron beam exposure method). For this reason, a further improvement in a throughput is required in mass-production.

FIGS. 4(a)–(b) are schematic views of a conventional EPL (electron beam projection lithography) mask.

When the size of a batch projection region on a mask is, 1 mm$^2$, a drawing pattern is divided into the size of 1 mm$^2$ as shown in FIG. 4(b).

Finally, when arranging 1 mm$^2$ size batch projection regions on an 8 inch silicon wafer 43, as conventionally shown in FIG. 4(c), they are arranged so that the move distance, i.e., the move time from a certain batch projection region to the next batch projection region to be projected may become short. Therefore, in many cases, each of the batch projection regions is arranged so that the adjacency relations of the original drawing pattern may change as little as possible.

Consequently, the imbalance of the pattern density will arise all over the 8 inch wafer, and according to this imbalance of pattern density, stress occurs at the time of mask manufacturing and electron beam irradiation. Thus curvature and distortion arise on a mask and a wafer. Accordingly, the position accuracy of a pattern worsens.

Since high projection accuracy is one of the important objects of the EPL mask, curvature and distortion of the mask or wafer are problems.

As a technology relevant to this invention, there is a technology described in Publication of Japanese Laid-Open patent No. 7-66098.

However, in the conventional mask manufacturing method, there were problems that the imbalance of pattern density arose all over the wafer, the stress generated at the time of mask manufacturing and electron beam irradiation, the curvature and distortion of a wafer arose, and the position accuracy of a pattern deteriorated.

For example, a manufacturing method of the mask for X-ray steppers is described in Publication of Japanese Laid-Open patent No. 63-110634. In this publication, it is disclosed that since the X-ray stepper uses an X-ray absorbing material having same density for a pattern region and a cover region, shrink and curvature of the X-ray absorbing material by the stress is prevented.

This technology is effective to relieve the stress in a single batch projection region.

However, in this invention, in the case of the mask with which a plurality of batch projection regions are arranged in manner of a matrix, an equalization of the pattern density on the whole wafer surface isn't realized. Rather, there is a possibility of enlarging imbalance of the pattern density on the whole wafer surface, and the stress concentrated on the specific region of the whole wafer surface cannot be prevented.

SUMMARY OF THE INVENTION

The electron beam projection mask of the present invention is characterized by arranging batch projection regions so that the pattern density may be equalized on the whole semiconductor substrate surface.

DESCRIPTION OF THE PREFERRED EMBODIMENTS

Figure 1:
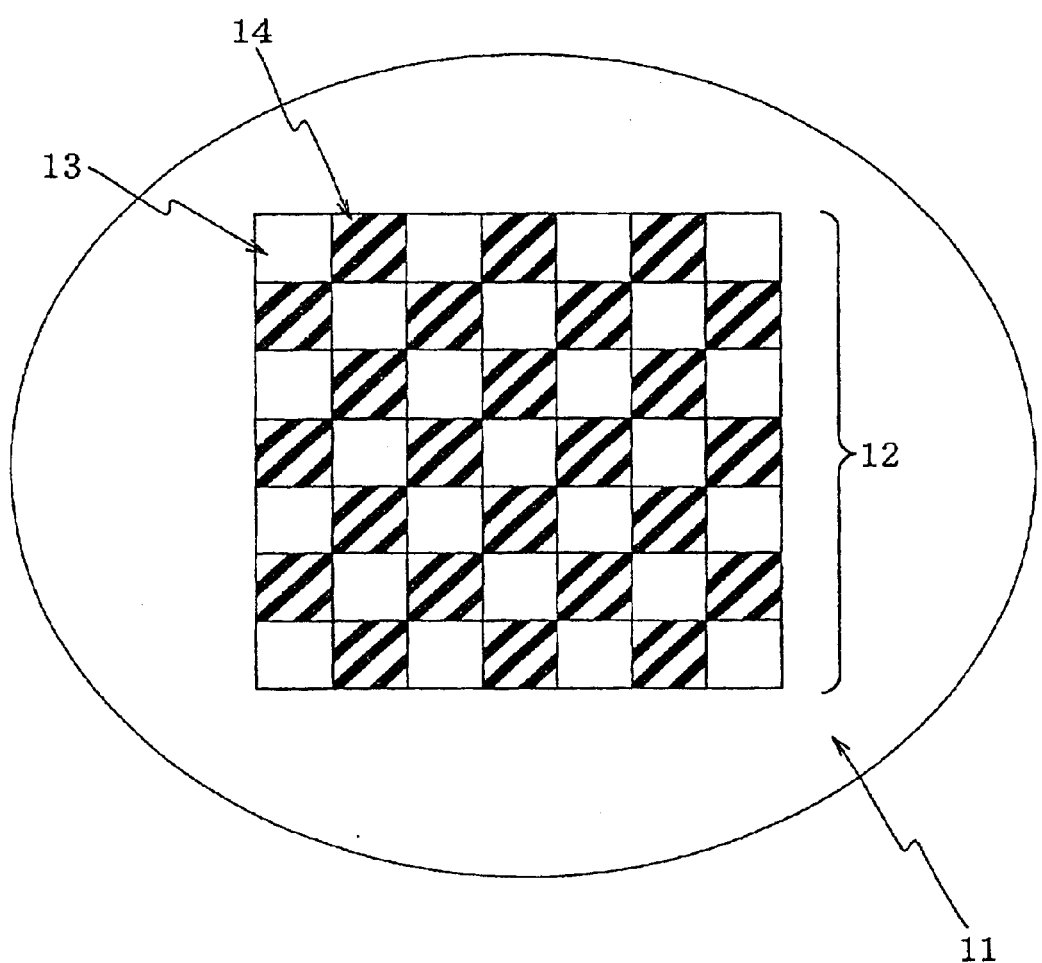
FIG. 1 is a schematic view of an embodiment of the electron beam projection mask of the present invention.

FIG. 1 shows a schematic view of one embodiment of the electron beam projection mask according to the present invention.

In a present embodiment, when arranging the batch projection regions having a predetermined size in the manner of a matrix (12) on the 8 inch wafer 11 used as a semiconductor substrate, the patterns are arranged so that the pattern density may be equalized as much as possible on the whole wafer surface.

For example, the region 14 (diagonal region) where pattern density is high and the region 13 (white region) where pattern density is low are alternatively arranged like a checkered flag.

When they are arranged in this way, the imbalance of the pattern density on the whole 8 inch wafer surface decreases, thus a stress generated by the mask manufacturing and electron beam irradiation decreases. As a result, the curvature and distortion of a wafer become small, and degradation of the position accuracy of a pattern can be prevented.

The embodiment of this invention is hereafter explained in detail using a drawing.

Figure 2A:
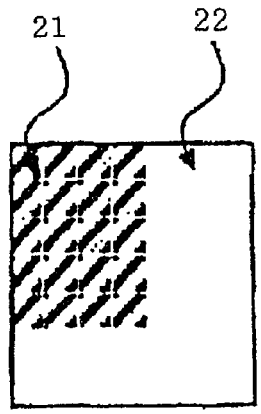
FIGS. 2(a)–2(c) are schematic views of an EPL (electron beam projection lithography) mask of an embodiment of the present invention.
Figure 2A:
Figure 2B:
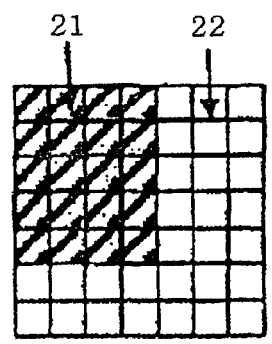
Figure 2B:
Figure 2C:
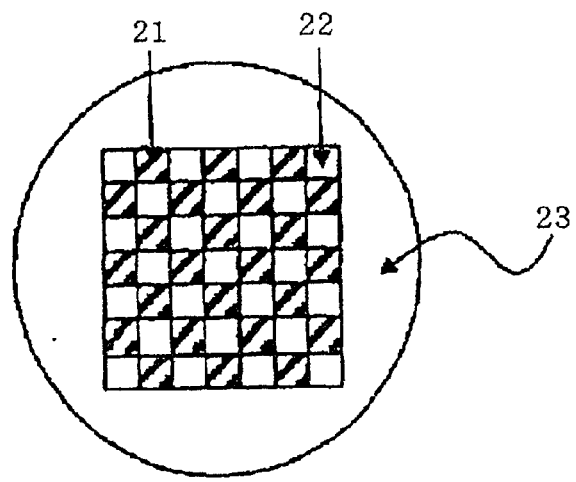

Referring to FIGS. 2(a)–2(c), there are shown schematic views of the EPL (electron beam projection lithography) mask as one embodiment of the present invention.

First, a pattern to be drawn has a pattern density which is not uniform and is out of balance all over the substrate, as shown in FIG. 2(a).

Here, the region 21 (diagonal region) where pattern density is high and the region 22 (white region) where pattern density is low are distributed, as shown in FIG. 2(a), respectively.

Next, if the size of the batch projection region on a mask is 1 mm, a drawing pattern is divided into 1 mm portions as shown in FIG. 2(b).

Finally, when arranging the batch projection regions of 1 mm on the 8 inch silicon wafer 23 as a semiconductor substrate, batch projection regions are arranged, for example, in the manner of a checkered flag so that pattern density may be equalized as much as possible on the whole wafer surface, as shown in FIG. 2(c).

Thus, when the imbalance of the pattern density on the whole 8 inch wafer surface decreases, stress of the mask and substrate generated at the time of mask manufacturing and electron beam irradiation decreases, the curvature and distortion of a mask and wafer become small, and deterioration of the position accuracy of a pattern can be prevented.

Figure 3A:
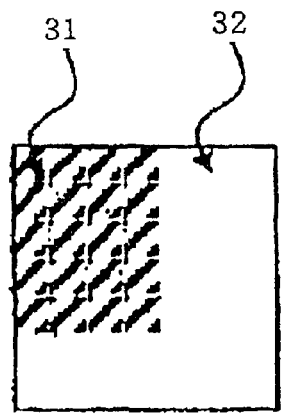
FIGS. 3(a)–3(c) are schematic views of an EPL mask of another embodiment of the present invention.
Figure 3A:
Figure 3B:
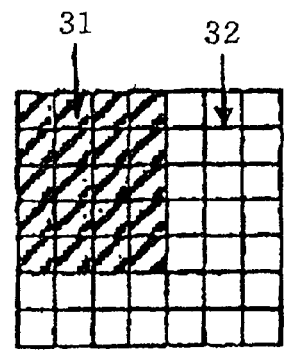
Figure 3B:
Figure 3C:
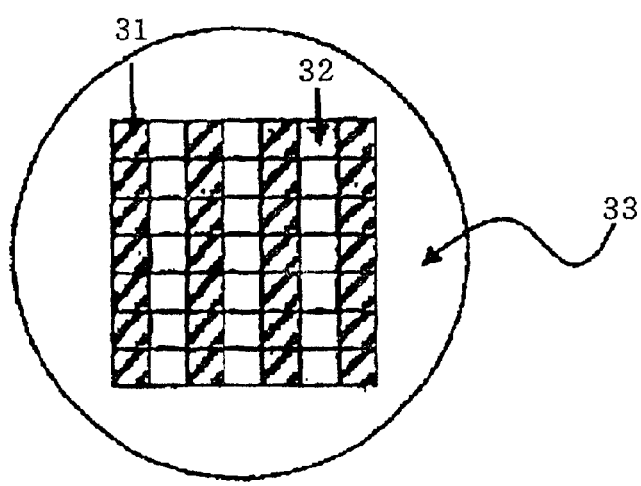
Figure 4A:
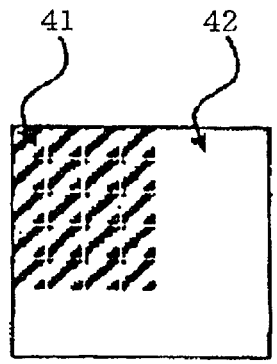
FIGS. 4(a)–4(c) are schematic views of a conventional EPL mask.
Figure 4A:
Figure 4B:
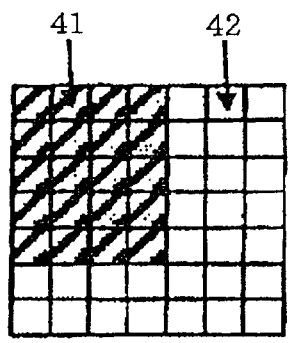
Figure 4B:
Figure 4C:
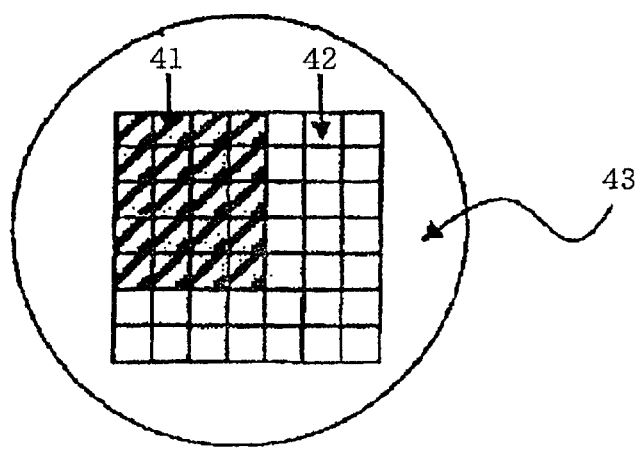

Moreover, as shown in FIGS. 3(a)–3(c), pattern density can also be equalized by arranging the batch projection regions so that the region 31 (diagonal region) where pattern density is high, and the region 32 (white region) where pattern density is low form a stripe shape, alternatively.

In the above-mentioned embodiment, although the present embodiment is utilized for EPL (electron beam projection lithography) mask, even if it is applied to the partial batch electron beam exposure mask, the same effect is acquired.

Here, the electron beam exposure mask is explained.

Conventionally, in the electron beam exposure method, the pattern is drawn in manner of single stroke, without using a mask at all. In this method, since the mask is not necessary, cost for the mask is nothing. Moreover, there is no need to recreate a mask to change some mask patterns suddenly.

However, the EB exposure method has a low throughput which prevents mass-production.

Recently, a mask is used for the electron beam exposure to improve the throughput. The mask used for the EB exposure method is roughly divided into a stencil type mask and a membrane type mask.

A stencil mask and its production method are described in, for example, Publication of Japanese Laid-Open patent No. 5-216216. The stencil mask has an opening portion (does not have a substance), electrons are passed through the opening portion, and in a portion without an opening, electrons are scattered and does not pass through.

Usually, the opening pattern is formed by a method of dry etching which uses chemical gas to make a hole on the silicon wafer.

A stencil type mask is advantageous to achieve an excellent contrast. An electron passes without being scattered since the opening portion does not have a substance, and at the portion without the opening has a predetermined thickness with silicon, almost all electrons can not pass (mere a few passes). However, since a pattern is formed by an opening, an inner pattern falls, so, a doughnut pattern etc. is not realizable.

On the other hand, the membrane type mask is described in Publication of Japanese Laid-Open patent No. 5-62888. The membrane type mask is made by forming an electron dispersion film on an electron penetration film, and pattern is formed by removing the electron dispersion film. The portion in which the electron dispersion film remains does not let an electron pass, but the portion in which an electron dispersion film does not exist (namely, portion in which only an electron penetration film exists) permits an electron to penetrate.

However, even when an electron penetration film is used, since some electrons are scattered, contrast is not so excellent as the stencil type mask. However, since the electron dispersion film is arranged on the electron penetration film, a doughnut pattern can be formed.

Though this membrane type mask is developed for X-ray lithography, it is possible to use also for EB lithography, at present. That is, many of membrane type masks used for X-ray lithography can be used also for electron lithography. Fundamentally, the X-ray dispersion film scatters electrons, and an X-ray penetration film permits electrons to penetrate. Generally, the mask is produced by using a silicon nitride film as an electron penetration film, and covered with heavy metals such as tungsten and chromium as an electron dispersion mask.

In addition, in the industry of EB lithography, the mask means the stencil type mask in many cases. Also the mask is called as an aperture or a reticle. It is because the mask having openings is advantageous in order to improve contrast.

However, in recent years, there is a technology of EPL which enables the batch exposure of the large area to realize a high throughput. This technology aims to carry out the batch exposure of the large area, and a doughnut pattern is also concerned, there is a movement which is going to apply the membrane type mask which can also form a doughnut pattern. If the stencil type mask of a doughnut pattern is divided into two masks and perform the projection exposure with two masks, a doughnut pattern can be formed.

According to this invention, as explained above, when the imbalance of the pattern density on the whole wafer surface decreases, stress generated at the time of mask manufacturing and electron beam irradiation decreases, the curvature and distortion of a wafer become small, thus deterioration of the position accuracy of a pattern can be prevented.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2001-016085 (Filed on Jan. 24, 2001) including specification, claims, drawings and summary are incorporated herein by reference in its entirety.

What is claimed is:

1. An electron beam projection mask for use in forming a plurality of high density and low density batch projection regions on a semiconductor substrate so that pattern density may be equalized all over said semiconductor substrate,
wherein said high density and low density batch projections are equal in area.

2. An electron beam projection mask according to claim 1, wherein the mask is a stencil type mask.

3. An electron beam projection mask according to claim 1, wherein the mask is a membrane type mask.

4. An electron beam projection mask according to claim 1, wherein the mask is a partial batch electron beam projection mask.

5. An electron beam projection mask according to claim 2, wherein the mask is a partial batch electron beam projection mask.

6. An electron beam projection mask according to claim 3, wherein the mask is a partial batch electron beam projection mask.

7. An electron beam projection mask as claimed in claim 1, wherein the mask is an electron beam projection lithography mask.

8. An electron beam projection mask as claimed in claim 2, wherein the mask is an electron beam projection lithography mask.

9. An electron beam projection mask as claimed in claim 3, wherein the mask is an electron beam projection lithography mask.

* * * * *